United States Patent
Gunn

(10) Patent No.: US 10,965,309 B1
(45) Date of Patent: Mar. 30, 2021

(54) DIGITAL DELTA-SIGMA MODULATOR WITH DYNAMICALLY ADJUSTABLE OUTPUT FREQUENCY BAND

(71) Applicant: RAYTHEON COMPANY, Waltham, MA (US)

(72) Inventor: Brian A. Gunn, Goleta, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/745,200

(22) Filed: Jan. 16, 2020

(51) Int. Cl.
*H03M 3/00* (2006.01)
*H03M 1/12* (2006.01)

(52) U.S. Cl.
CPC ........... *H03M 3/322* (2013.01); *H03M 3/396* (2013.01); *H03M 3/498* (2013.01); *H03M 1/12* (2013.01); *H03M 1/124* (2013.01); *H03M 1/1245* (2013.01); *H03M 3/30* (2013.01)

(58) Field of Classification Search
CPC .......... H03M 3/30; H03M 1/12; H03M 1/124; H03M 1/1245
USPC ................. 341/143, 155, 122, 123
See application file for complete search history.

(56) References Cited

U.S. PATENT DOCUMENTS

| | | | |
|---|---|---|---|
| 6,057,791 A * | 5/2000 | Knapp | G06F 1/08 341/122 |
| 9,094,033 B1 | 7/2015 | Lye | |
| 9,172,392 B2 | 10/2015 | Nentwig et al. | |
| 2015/0280724 A1 | 10/2015 | Menkhoff et al. | |

OTHER PUBLICATIONS

Ibrahim, "A Novel Feedforward Noise Shaping for Word-Length Reduction" IEEE International Conference on Acoustics, Speech and Signal Processing (Icassp), IEEE, Mar. 20, 2016 (pp. 4448-4452).
International Search Report for corresponding International Application No. PCT/US2020/053157, filed Sep. 28, 2020, International Search Report dated Dec. 18, 2020 and dated Jan. 14, 2021 (5 pgs.).
Written Opinion of the International Searching Authority for corresponding International Application No. PCT/US2020/053157, filed Sep. 28, 2020, Written Opinion of the International Searching Authority dated Jan. 14, 2021 (9 pgs.).

* cited by examiner

*Primary Examiner* — Joseph J Lauture
(74) *Attorney, Agent, or Firm* — Lewis Roca Rothgerber Christie LLP

(57) ABSTRACT

A delta-sigma modulator (DSM) with non-recursive computation of delta-sigma residues comprising: an input port for receiving a digital input signal; a residue calculation circuit coupled to the input port for calculating delta-sigma residues non-recursively; a DSM output calculation circuit coupled to the output of the residue calculation circuit for generating an output of the DSM; and a second input port for receiving a control signal, wherein the control signal dynamically adjusts an output frequency band of the DSM.

20 Claims, 5 Drawing Sheets

DIGITAL DELTA-SIGMA MODULATOR WITH DYNAMICALLY ADJUSTABLE OUTPUT FREQUENCY BAND

FIELD OF THE INVENTION

The disclosed invention relates generally to signal generation and more specifically to a digital delta-sigma modulator with non-recursive (direct) computation of residues and dynamically adjustable output frequency.

BACKGROUND

Over the last few decades, the capability of digital systems has dramatically increased, also with a significant reduction in size, weight, power, and cost (SWAP-C). Digital systems and signals differ from their analog counterparts primarily because they are quantized (discrete in value) and sampled (discrete in time). Analog-to-digital converters (ADCs) sample and quantize an analog signal to create a digital signal, a process known as digitization. Conversely, digital-to-analog converters (DACs) generate analog signals from digital signals. ADCs and DACs are often at the boundary of a digital system, determining much of the system's performance in its interaction with the environment.

Both ADCs and DACs are governed by the Nyquist Sampling Criterion, which specifies the bandwidth of a digital signal to be no greater than the Nyquist bandwidth, which is half the sampling rate for a real signal with uniform sampling. If the Nyquist Criterion is satisfied, an analog signal can be digitized and then perfectly reconstructed using the digital samples. If the Nyquist criterion is violated, irreversible corruption may occur due to aliasing. In practice, signal bandwidths are typically noticeably less than the Nyquist bandwidth.

For an ADC to satisfy the Nyquist Sampling Criterion, the analog signal must be filtered to a bandwidth less than the Nyquist bandwidth of the converter before digitization. For a DAC, analog filtering is generally performed to reduce spectral artifacts outside the Nyquist bandwidth of the represented signal. Examples of ADC applications include the receive path of digital coherent radar, communications, networking, electronic warfare, and control circuitry. DACs might be used on the transmit side for each of those applications.

Nyquist-rate ADCs and DACs are a class of converters whose converted signal typically has a bandwidth comparable to the Nyquist bandwidth. These converters generally have more bits and therefore more levels of quantization compared to alternative classes of converters.

Delta-sigma converters are in a separate class of converters. In contrast to Nyquist-rate converters, delta-sigma converters are oversampled converters, meaning their Nyquist bandwidth is much greater than the signal bandwidth. The specific ratio at which a delta-sigma DAC samples compared to the Nyquist rate is specified as the converter's oversampling ratio (OSR).

Specific instances of delta-sigma converters may have comparable performance to Nyquist-sampled converters, with reduced size, weight, power, and/or cost. In some instances, Delta-sigma converters are implemented as part of a digital integrated circuit (IC) or field-programmable gate array (FPGA), eliminating the need for an external converter chip and thereby reducing circuit complexity, cost, power consumption, and latency. Delta-sigma converters typically are highly quantized (fewer bits), but can retain the signal quality over the signal bandwidth through oversampling and spectral shaping of the quantization noise away from the signal. This shaping occurs through a feedback loop. The quantization error of previous samples are used to adjust the value of subsequent pre-quantization samples. Higher OSRs improve the noise shaping (OSR is often more than 10). Delta-sigma ADCs differ fundamentally from delta-sigma DACs in that the delta-sigma ADC's feedback loop is mixed signal (analog and digital), whereas the delta-sigma DAC feedback is purely digital.

Typically, a delta-sigma DAC comprises an input, a quantizer, an output, and a feedback path. The feedback path uses the difference (a.k.a. residue or error) between the pre-quantized signal and its quantized approximation. The specific feedback logic determines the characteristics of the noise shaping. Note that the quantized approximation may be represented in the output signal as binary (e.g. a binary 1 or binary 0 for a 1-bit output), the representation of which is scaled (e.g. multiplied by some gain) and offset (e.g. to a set 0-mean) before differencing.

Output sample rate directly impacts delta-sigma DAC performance; increasing the output sample rate increases either the operational signal bandwidth or the output's dynamic range. An increase in output sample rate with a constant signal bandwidth increases the OSR and thereby the SNR. An increase in output sample rate with constant OSR increases the operable bandwidth. The theoretical dynamic range performance of the first-order delta-sigma DAC is limited by the signal-to-noise ratio (SNR, in dB):

$$\text{SNR} < 9.03 \log_2(\text{OSR}) - 12.12 \qquad (1)$$

The spectral shaping of delta-sigma DACs produces a frequency band around which the output signal exhibits the highest dynamic range. The location of this band depends on the configuration and structure of the delta-sigma modulator and the output sample rate. For a low-pass delta-sigma DAC the output band is centered around 0 Hertz. For a band-pass delta-sigma DAC, the output band is centered around some frequency relative to the output sampling rate.

Delta-sigma DACs are typically modeled and implemented recursively, A system or processes is recursive when the current state is determined using a previous state.

FIG. 1 is a simplified block diagram of a conventional fully recursive 1-bit low-pass delta-sigma DAC 100, As shown, a multi-bit oversampled signal 102 is input to the delta-sigma DAC 100. The input signal 102 is combined with a residue (error) signal 122 by an addition circuit 104 to produce an error-compensated signal 105. Signal 105 is quantized to 1 bit using a compare-to-zero comparator 106 to generate a modulated output signal 108, Signal 108 is then output from the delta-sigma DAC 100. Signal 108 is also fed back to a switch 116, The switch 116 interprets the encoding of the output signal 108 to the appropriate scale and offset relative to the error-compensated signal 105, Switch 116 takes a gain of the DSM (g) as its input and outputs the value of g 112 (same as its input) when signal 108 has a value of "1," and a value of negative g when signal 108 has a value of "0", The output of the switch 116 is combined with the error-compensated signal 105 by a subtraction circuit 118 to produce a 0-delay residue 119, The residue 122 is delayed by one clock cycle relative to the 0-delay residue 119 by a delay block 120.

The low-pass delta-sigma modulator in FIG. 1 can be modeled mathematically as $$y[n] = x_{int}[n] + \varepsilon[n-1] \quad (2)$$

$$x_b[n] = \begin{cases} 1, & y[n] > 0 \\ 0, & \text{otherwise} \end{cases} \quad (3)$$

$$\varepsilon[n] = y[n] + \begin{cases} -g, & y[n] > 0 \\ g, & \text{otherwise} \end{cases} \quad (4a)$$

$$= y[n] + \begin{cases} -g, & x_b[n] = 1 \\ g, & x_b[n] = 0 \end{cases} \quad (4b)$$

$$= y[n] + g + \begin{cases} -2g, & x_b[n] = 1 \\ 0 & x_b[n] = 0 \end{cases} \quad (4c)$$

$$= y[n] + g - 2gx_b[n] \quad (4d)$$

where

| n | is time index | |
|---|---|---|
| $x_{int}[n]$ | is oversampled signal | 102 |
| y [n] | is error-compensated signal | 105 |
| $x_b$ [n] | is output signal | 108 |
| ε [n] | is 0-delay residue | 119 |
| ε [n −1] | is residue | 122 |
| g | is value for feedback gain | 112 |

This conventional delta-sigma DAC 100 is fully recursive since each signal (excluding the input signal 102) is expressed in terms that are dependent on some value of a previous clock cycle.

A recursive implementation's output data rate is limited to the rate at which the (loop) computation can be completed. In other words, a fully-recursive delta-sigma DAC has a maximum output data rate equal to the logic clock. This, in turn, limits the delta-sigma DAC's performance. Prior art approaches attempt to parallelize and pipeline the delta-sigma DAC to achieve higher performance, but all introduce non-idealities which produce spectral artifacts or other degradation in the quality of the output signal.

A higher delta-sigma DAC output rate may be achieved while preserving signal quality by pre-computing the output waveform. The computation is performed at slower rate than the rate of the output transmission. The a-priori waveform is stored in memory, and recalled when transmission is desired, potentially at a much higher rate than the logic which generated it. The use of this approach is greatly limited and impractical for many applications, because it assumes a priori knowledge of the desired waveform. Accordingly, there is a need for a high-performance real-time delta-sigma DAC which overcomes these limitations. Existing fully-recursive band-pass delta-sigma DACs have the same limitation described for low-pass delta-sigma DACs.

FIG. 2 is a simplified block diagram of a typical fully recursive generalized 1-bit second-order delta-sigma DAC 200, As shown, a multi-bit oversampled signal 202 is input to the delta-sigma DAC 200. The input signal 202 is combined with a first compensation signal 238 by an addition circuit 204 to produce first compensated signal 206. Signal 206 is combined with a second compensation signal 230 by an addition circuit 208 to produce a second compensated signal 210. The signal 210 is quantized to 1 bit using a compare-to-zero comparator 212 to generate a modulated output signal 214. Signal 214 is then output from the delta-sigma DAC 200. Signal 214 is also fed back to a switch 220. The switch 220 interprets the encoding of the output signal 214 to the appropriate scale and offset relative to the error-compensated signal 210. For the 1-bit low-pass DSM shown, switch 220 takes a gain of the DSM (g) as its input and outputs the value of g 216 (same as its input) when signal 214 has a value of "1" and a value of negative g when signal 214 has a value of "0", The output of the switch 330 is combined with the second error-compensated signal 210 by a subtraction circuit 220 to produce a 0-delay residue 223. The residue 223 is delayed by one clock cycle relative to the 0-delay residue 223 by a delay block 224 to produce a 1-delay residue 226. The 1-delay residue 226 is multiplied by a first constant multiplier 228 to produce the second compensation signal 230. The 1-delay residue 226 is also delayed by one clock cycle relative to the 1-delay residue 226 by delay block 232 to produce a 2-delay residue 234. The 2-delay residue 234 is multiplied by a second constant multiplier 236 to produce the first compensation signal 238. The output noise shaping depends on the values of the constant multipliers 228 and 236. For example, if the first multiplier 228 uses a value of 1 and the second constant multiplier 236 uses a value of 0, the model is equivalent to the low-pass delta sigma DAC of FIG. 1.

The delta-sigma modulator in FIG. 2 can be modeled mathematically as $$y[n] = x_{int}[n] + a_1\varepsilon[n-1] + a_2\varepsilon[n-2] \quad (5)$$

$$x_b[n] = \begin{cases} 1, & y[n] > 0 \\ 0, & \text{otherwise} \end{cases} \quad (6)$$

$$\varepsilon[n] = y[n] + \begin{cases} -g, & y[n] > 0 \\ g, & \text{otherwise} \end{cases} \quad (7a)$$

$$= y[n] + \begin{cases} -g, & x_b[n] = 1 \\ g, & x_b[n] = 0 \end{cases} \quad (7b)$$

$$= y[n] + g + \begin{cases} -2g, & x_b[n] = 1 \\ 0 & x_b[n] = 0 \end{cases} \quad (7c)$$

$$= y[n] + g - 2gx_b[n] \quad (7d)$$

where

| n | is time index | |
|---|---|---|
| $x_{int}$ [n] | is oversampled signal | 202 |
| y [n] | is $2^{nd}$ compensated signal | 210 |
| $x_b$ [n] | is output signal | 214 |
| ε [n] | is 0-delay residue | 223 |
| ε [n −1] | is 1-delay residue | 226 |
| ε [n −2] | is 2-delay residue | 234 |
| g | is value for feedback gain | 216 |

The output sampling rate and the values $a_1$ and $a_2$ used for multipliers 228 and 236, respectively, are typically static. However, a fully-recursive delta-sigma DAC experiences the associated limitations discussed earlier, whether dynamic or static multiplier values and output sampling rate are used.

SUMMARY

In some embodiments, the disclosed invention is a digital delta-sigma modulator (DSM) with non-recursive computation of delta-sigma residues with dynamically adjustable output frequency band. The DSM includes: an input port for receiving a digital input signal; a residue calculation circuit coupled to the input port for calculating delta-sigma residues non-recursively; a DSM output calculation circuit coupled to the output of the residue calculation circuit for generating an output of the DSM; and a second input port for receiving a control signal, wherein the control signal dynamically adjusts an output frequency band of the DSM.

In some embodiments, the disclosed invention is a method for non-recursive computation of delta-sigma residues. The method includes: receiving a digital input signal; calculating delta-sigma residues non-recursively; generating an output of the DSM; and dynamically adjusting an output frequency band of the DSM responsive to a control signal.

In some embodiments, the disclosed invention is a digital-to-analog converter (DAC) comprising a digital DSM with non-recursive computation of delta-sigma residues. The DSM includes: an input port for receiving a digital input signal; a residue calculation circuit coupled to the input port for calculating delta-sigma residues non-recursively; a DSM output calculation circuit coupled to the output of the residue calculation circuit for generating an output of the DSM; and a second input port for receiving a control signal, wherein the control signal dynamically adjusts an output frequency band of the DSM.

In some embodiments, the DSM further includes a frequency band selection controller circuit that receives the control signal and outputs a reconfiguration signal to select an output control signal to control operation of one or more of the residue calculation circuit and DSM output calculation circuit. In some embodiments, the DSM further includes a frequency modulation circuit, where the output control signal controls operation of the frequency modulation circuit to select a modulation scheme. In some embodiments, the control signal controls operation of the residue calculation circuit to selecting a plurality of coefficients to use. In some embodiments, the DSM further includes a frequency modulation circuit that receives the control signal and outputs a reconfiguration signal to the frequency modulation circuit to modulate an output of the interpolator to a desired output frequency band.

BRIEF DESCRIPTION OF THE DRAWINGS

These and other features, aspects, and advantages of the disclosed invention will become better understood with regard to the following description, appended claims, and accompanying drawings.

DETAILED DESCRIPTION

In some embodiments, the disclosed invention is a non-recursive delta-sigma modulator (DSM) with dynamically adjustable output frequency band. The direct (non-recursive) computation of delta-sigma modulator (DSM) residues enables increased achievable output DSM sample rates through parallelization and pipelining relative to a fully-recursive DSM. The increased output sample rate enables higher performance from the DSM, which is useful in a variety of applications.

The ability to dynamically adjust output frequency band improves flexibility, modularity, frequency-agile, multi-function and software-defined operation. In some embodiments, the output frequency band is adjusted by changing the delta-sigma modulator characteristics. In some embodiments, the output frequency band is adjusted by changing the output sampling rate.

Figure 3:
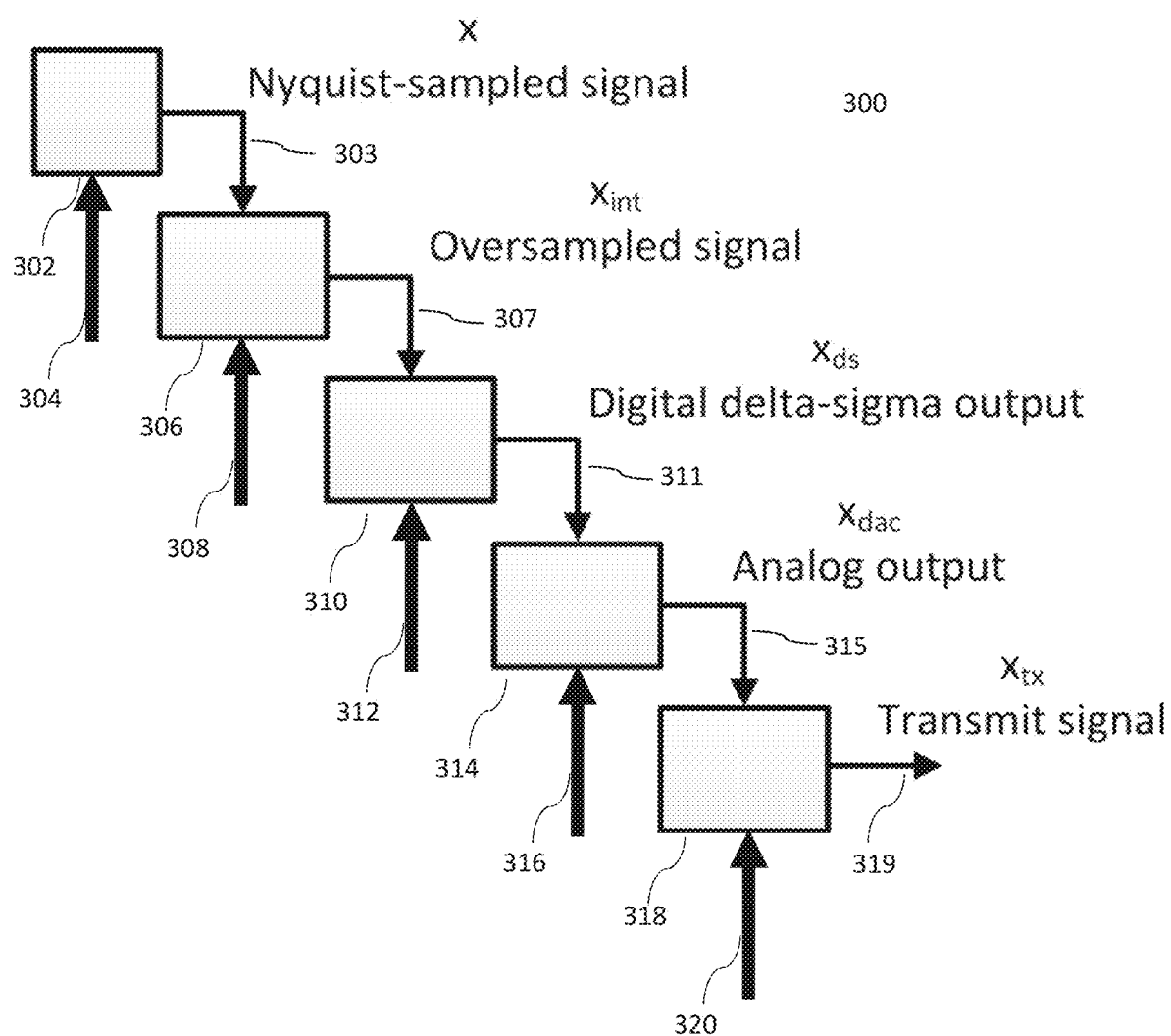
FIG. 3 is a block diagram of an exemplary transmit path of a radio frequency (RF) system, according to some embodiments of the disclosed invention.

FIG. 3 is a block diagram of an exemplary transmit path of a digital system for RF transmission, according to some embodiments of the disclosed invention. As shown, a signal generator 302 generates a Nyquist-sampled (not highly-oversampled) baseband signal 303 x. A digital interpolator 306 interpolates the baseband signal and generates an oversampled signal 307 $x_{int}$ at a higher sampling rate. As the baseband signal 303 x is Nyquist-sampled, the interpolation factor of the digital interpolator 306 is equal to the oversampling ratio. The oversampled signal 307 $x_{int}$ is input to a non-recursive DSM 310. The output 311 $x_{ds}$ of the non-recursive DSM 310 is then converted to the analog domain by output circuit 314 to generate analog signal 315 $x_{DAC}$. Further analog processing and filtering is performed on 315 $x_{DAC}$ by analog circuitry 318 before it is transmitted as a transmit RF signal 319 $x_{tx}$.

To achieve dynamic adjustment of output frequency band, the blocks in FIG. 3 also have input ports for control signals. A signal selector control signal 304 selects which Nyquist-sampled signal 303 $x_{int}$ to use, corresponding to the desired output frequency band, for example if multiple Nyquist-sampled signals are available. An interpolation filter control signal 308 controls the characteristics of the interpolation and filtering, for example to match the interpolation passband to the DSM output frequency band. DSM control signal 312 controls the coefficients and structure of the DSM and non-recursive computation of residues, for example the selection of a 1, 2, or 3-phase interpolator and the modulation appropriate for the desired DSM output frequency band, Output control signal 316 controls the characteristics of the output circuitry, for example to optimize the parameters of the digital transceiver for the desired DSM output frequency band. Analog circuit control signal 320 controls the characteristics of the analog circuitry, for example to match the analog filters to the desired DSM output frequency band.

In some embodiments, these control signals may be composite, representing multiple functional controls or commands and clocking signals. In some embodiments, these controls are coordinated to achieve acceptable performance for a particular output frequency band.

In some embodiments, the direct computation of residue receives a Nyquist-sampled (not highly oversampled) input signal instead of the oversampled signal and resource usage may be reduced by bypassing the preceding interpolation block 304, In these embodiments, the interpolation operation may be performed by the same circuit that performs the delta-sigma modulation and non-recursive computation of residues.

In some embodiments, the baseband signal x is a complex baseband representation of a higher-frequency signal, in which case frequency conversion/mixing may be performed as part of or subsequent to interpolation 304. In some embodiments, the interpolation 304 and mixing (if applicable) may be performed within the recursive DSM 306 for reduced overall resource utilization. In some embodiments, the baseband signal x is mixed such that its Nyquist bandwidth is up-converted to be centered at the center frequency of the delta-sigma output band. In some embodiments, the center frequency of the delta-sigma output band is equal to a fraction of the delta-sigma output sample rate $f_s$. In some embodiments, the output band is centered around $f_s/6$, $f_s/4$, $f_s/3$, or other ratios of the sampling rate. In some embodiments, the selection of output band is dynamic by changing the delta-sigma modulator characteristics or structure. In some embodiments, the selection of output band is dynamic by changing the delta-sigma output sample rate.

The non-recursive DSM representation can be derived using an ordinary difference equation (ODE) model to represent a portion of the DSM. The particular solution $y_3$ of the ODE is derived using well-established ODE methods. The delta-sigma residue is then identically determined from $y_p$.

Figure 1:
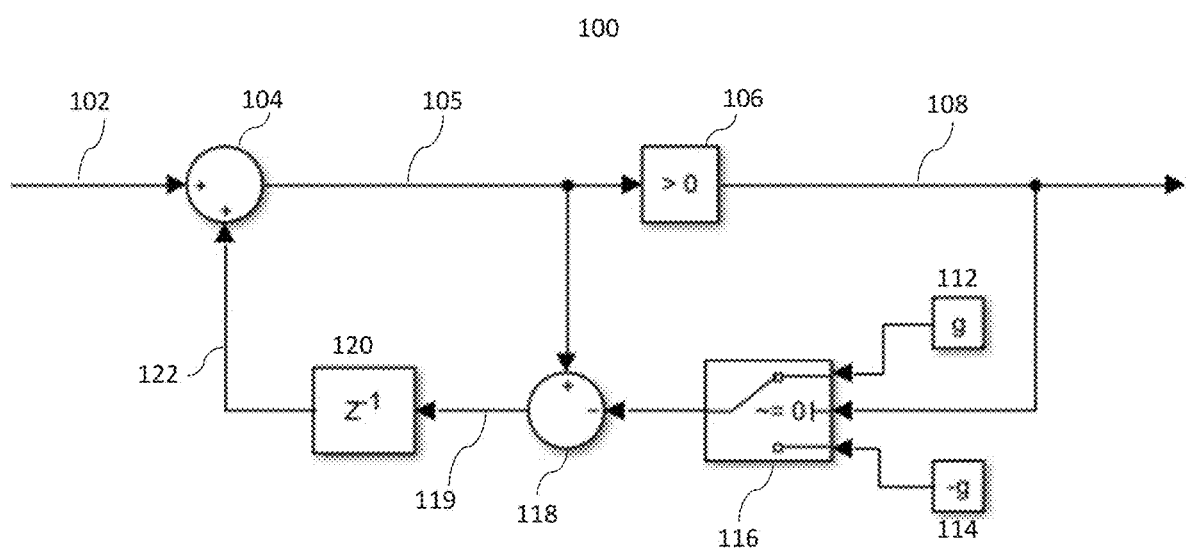
FIG. 1 is a simplified block diagram of a conventional fully recursive 1-bit low-pass delta-sigma DAC 100.
Figure 2:
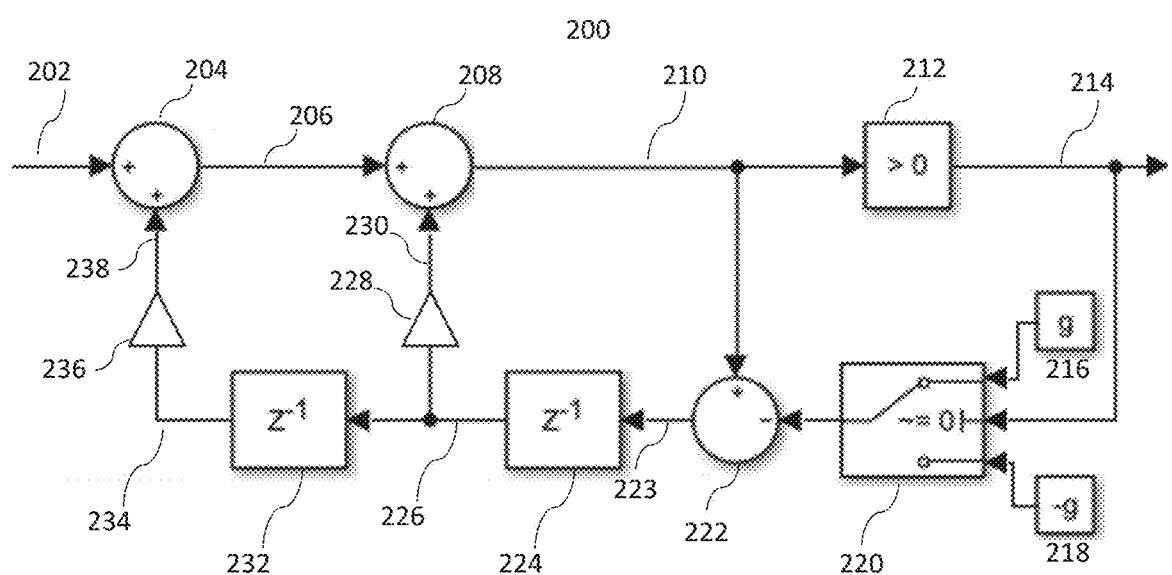
FIG. 2 is a simplified block diagram of a typical fully recursive generalized 1-bit second-order delta-sigma DAC 200.

The circuit depicted in FIG. 2 and the corresponding Equation 5, Equation 6, and Equation 7 describe an ODE if the DSM gain g is 0. Equation 7 becomes $$\varepsilon'[n] = y_p[n] \quad (8)$$

Equation 2 becomes $$y_p[n] = x_{int}[n] + \varepsilon'[n-1] = x_{int}[n] + a_1 y_p[n-1] + a_2 y_p[n-2] \quad (9)$$

which is the recursive form of the ODE, where

| | |
|---|---|
| n | time index |
| $x_{int}[n]$ | oversampled signal |
| $y_p[n]$ | ODE particular solution |
| $\varepsilon'[n]$ | ODE particular solution |
| $a_1$ | First multiplier value |
| $a_2$ | Second multiplier value |

The signal $\varepsilon'[n]$ and $y_p[n]$ are now equivalent, representing the solution to the ODE relationship for a particular $x_{int}[n]$. They differ from $\varepsilon[n]$ and $y[n]$ in the original set of equations since their relationship no longer includes the feedback from switch 220 and addition circuit 222 of FIG. 2; however, $y_p[n]$ is directly related to $\varepsilon[n]$, e.g. as described later, in Equation 26.

The particular solution $y_p$ of the ODE for a second-order DSM can be determined using ODE methods. For ODE forcing function $f[n]$, Equation 9 can be re-written in ODE form $$f[n] = -x_{int}[n-1] = -y_p[n] + a_1 y_p[n-1] + a_2 y_p[n-2] = a_0 y_p[n] + [n-1] + a_2 y_p[n-2], \ a_0 = -1 \quad (10)$$

The homogeneous solution of the low-pass delta-sigma modulator, i.e. $(a_0, a_1, a_2) = (-1, 0)$, is $$y_h[n] = C \quad (11)$$

The constant C can be determined for the unit impulse response (UIR) solution, with boundary conditions $$y_{UIR}[n] = \begin{Bmatrix} 0, & n < 0 \\ C, & n \ge 0 \end{Bmatrix} \quad (12)$$

and forcing function $\partial[n]$, the discrete unit impulse response, $$f[n] = \partial[n] = \begin{Bmatrix} 1, & n = 0 \\ 0, & n \ne 0 \end{Bmatrix} \quad (13)$$

which results in $$y_{UIR}[n] = \begin{Bmatrix} 0, & n < 0 \\ -1, & n \ge 0 \end{Bmatrix} = -u[n], \quad (14)$$

u[n] being the unit step or accumulation function.

The particular solution $y_p$ for some causal $x_{int}$ is the convolution (*) of the UIR solution and $f[n] = -x_{int}[n]$, with $y_p[0] = 0$ resulting from the specific boundary conditions.

$$y_p[n] = y_{UIR}[n] * (-x_{int}[n]) \quad (15)$$

$$= u[n] * x_{int}[n]$$

$$= \sum_{n'=0}^{n-1} x_{int}[n']$$

The particular solution $y_p$ to the ODE for the low-pass DSM is closely related to the associated delta-sigma residue $\varepsilon$. For convenience, we define $$\bar{x}_b[n] = 1 - x_b[n] \quad (16)$$

$$= \begin{Bmatrix} 1, & y[n] \le 0 \\ 0, & \text{otherwise} \end{Bmatrix}$$

which allows us to write Equation 4 as:

$$\varepsilon[n] = y[n] + g - 2gx_b[n] \quad (17)$$

$$= y[n] + 2g\bar{x}_b[n] - g$$

Assuming the modulator is not being driven to saturation, i.e.

$$|y[n]| = |x_{int}[n] + \varepsilon[n-1]| < 2g, \quad (18)$$

it follows that $$\varepsilon[n] = y[n] + 2g\bar{x}_b[n] - g \quad (19)$$

$$= y[n] \% (2g) - g$$

$$= (x_{int}[n] + \varepsilon[n-1]) \% (2g) - g$$

where % is the modulus operator. Using recursive substitution:

$$\varepsilon[n] = (x_{int}[n] + \varepsilon[n-1])\%(2g) - g \quad (20)$$

$$= (x_{int}[n] + (x_{int}[n-1] + \varepsilon[n-2])\%(2g) - g)\%(2g) - g$$

$$= (x_{int}[n] + x_{int}[n-1] + \varepsilon[n-2] - g)\%(2g) - g$$

$$= (x_{int}[n] + x_{int}[n-1] + \varepsilon[n-2] + g)\%(2g) - g$$

and by extension $$\varepsilon[n] = \left(\sum_{n'=n_0}^{n} x_{int}[n'] + \varepsilon[n_0 - 1] + g(n - n_0)\right)\%(2g) - g. \quad (21)$$

Letting $n_0=0$ and $\varepsilon[n_0-1]=\varepsilon[-1]=$ $$\varepsilon[n] = \left(\sum_{n'=0}^{n} x_{int}[n'] + gn\right)\%(2g) - g \quad (22a)$$

$$= (y_p[n] + gn)\%(2g) - g \quad (22b)$$

where $y_p$ is, again, the particular solution of the associated ODE. Thus, the recursive component (e.g. $x_{int}[n]+\varepsilon[n-1]$) of the equation for DSM residues $\varepsilon[n]$ can be replaced by a non-recursive (direct) equivalent (e.g. $\Sigma_{n'=0}{}^n x_{int}[n']+gn$), which comprises an accumulation of the DSM input signal over time and an arithmetic offset g relative to the time index, the specific example being for a low-pass DSM.

The UIR for a band-pass DSM can be found in a similar manner as the low-pass DSM UIR. In some embodiments, with $(a_0, a_1, a_2)=(-1,1,-1)$ the UIR is $$y_{UIR}[n \geq 0] = \quad (23)$$
$$-\frac{2}{\sqrt{3}}\cos\left(\frac{\pi}{3}n + \frac{\pi}{6}\right) = \{-1, -1, 0, 1, 1, 0, -1, -1, 0, \ldots\}$$

In some embodiments, with $(a_0, a_1, a_2)=(-1,0,-1)$ the UIR is $$y_{UIR}[n \geq 0] = -\cos\left(\frac{\pi}{2}n\right) = \{-1, 0, 1, 0, -1, 0, 1, 0, \ldots\} \quad (24)$$

In some embodiments, with $(a_0, a_1, a_2)=(-1,-1,-1)$ the UIR is $$y_{UIR}[n \geq 0] = \quad (25)$$
$$-\frac{2}{\sqrt{3}}\cos\left(\frac{2\pi}{3}n + \frac{\pi}{6}\right) = \{-1, 1, 0, -1, 1, 0, -1, 1, 0, \ldots\}$$

In any case, the convolution of the UIR with the input signal as described above produces the solution particular to the input signal for the corresponding delta-sigma modulator. This convolution results in the accumulation of the input signal, similar to the low-pass DSM. However, while the low-pass DSM accumulates every sample into a single running sum, the band-pass DSM accumulator may have multiple phases, each of which may be accumulated independently, with modulation before or after accumulation.

For example, leveraging Equation 24, some embodiments are 2-phase modulated polyphase accumulator, where all even samples are accumulated after inverting every other even sample. Similarly, some embodiments using Equation 23 and Equation 25 are 3-phase modulated polyphase accumulators.

Leveraging the same assumptions as low-pass DSM, Equation 24 can be used to determine relationship between the band-pass DSM particular solution $y_p$ and the associated delta-sigma residue $\varepsilon$, given by $$\varepsilon[n]=(y_p[n]+gn)\%(2\text{ g})-g \quad (26)$$

where $y_p[n]$ is a modulated polyphase accumulator.

Note that for Equation 23 and Equation 25, the assumption defined by Equation 18 does not necessarily hold. Considering the fully-recursive Equation 9 for non-zero $a_1$ and $a_2$, for some n and $x_{int}[n]$, $|y[n]|>2$ g even though $|y[n-1]|<2$ g and $|y[n-2]|<2$ g. The errors introduced by using Equation 26 to calculate non-recursive residues for these and similar cases can be corrected by testing the assumption for each sample and compensating by adding or subtracting 2 g based on the DSM response and the value of the non-recursive residue. The output $x_b[n]$ can be determined from the non-recursive residue using Equation 5 and Equation 6.

Figure 4:
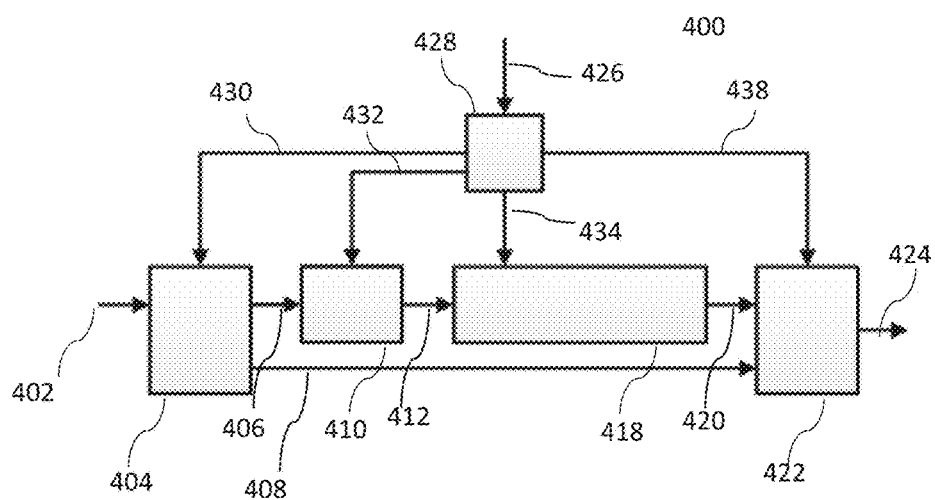
FIG. 4 is a simplified block diagram of an exemplary non-recursive delta-sigma modulator with dynamically adjustable output frequency band incorporating signal interpolation, according to some embodiments of the disclosed invention.

FIG. 4 is a simplified block diagram of an exemplary non-recursive delta-sigma modulator 400 with dynamically adjustable output frequency incorporating signal interpolation, according to some embodiments of the disclosed invention. In these embodiments, an interpolation operation is included in the DSM, however, as mentioned before, the interpolation operation may be performed outside of the DSM, As shown, a digital Nyquist-sampled baseband input signal 402 (for example, based on signal 303) is received by an input port. The baseband input signal 402 is fed to an interpolation filter 404, such as a finite impulse response (FIR) interpolation filter, which interpolates the baseband input signal 402 by an interpolation factor M to produce the oversampled signal 408.

In some embodiments, the interpolation filter 404 also mixes the interpolated signal before outputting it as oversampled signal 408. The interpolation filter 404 also outputs signal 406, which in some embodiments is substantially the same as signal 408. Signal 406 is input to a frequency modulation circuit 410 which modulates signal 406 based on the frequency of the UIR corresponding to the desired output frequency band to produce an intermediate signal 412. In some embodiments, the modulation is based on at least one of Equation 14, Equation 23, Equation 24, or Equation 25. The intermediate signal 412 is input to a non-recursive delta sigma residue calculation circuit 418 to produce non-recursive residue signal 420. In some embodiments, circuit 418 includes an accumulator to accumulate every sample into a single running sum. The band-pass DSM accumulator may have multiple phases, each of which may be accumulated independently, with modulation before or after accumulation.

Residue signal 420 and oversampled signal 408 are input to a delta-sigma kernel 422 (for example, circuit 500 of FIG. 5) to generate a delta-sigma output signal 424. A frequency band control signal 426 (for example, based on signal 312) is input to a frequency band selection controller 428, which outputs a reconfiguration signal 714 which selects outputs signals 430, 432, 434, 436, and 438 to control the operation of the other blocks to produce the desired output frequency band. Signal 430 is input to the interpolation filter 404 to control its behavior, for example, selecting an interpolation factor and interpolation coefficients. Signal 432 is input to the frequency modulation circuit 410 to control its behavior, for example, selecting a modulation scheme. Signal 434 is input to the non-recursive residue calculation circuit 418 to control its behavior, for example, selecting a number of phases for the accumulator. Signal 438 is input to the delta-sigma kernel 422 to control its behavior, for example, selecting the coefficients to use (for example, in multipliers 528 and 536).

Figure 5:
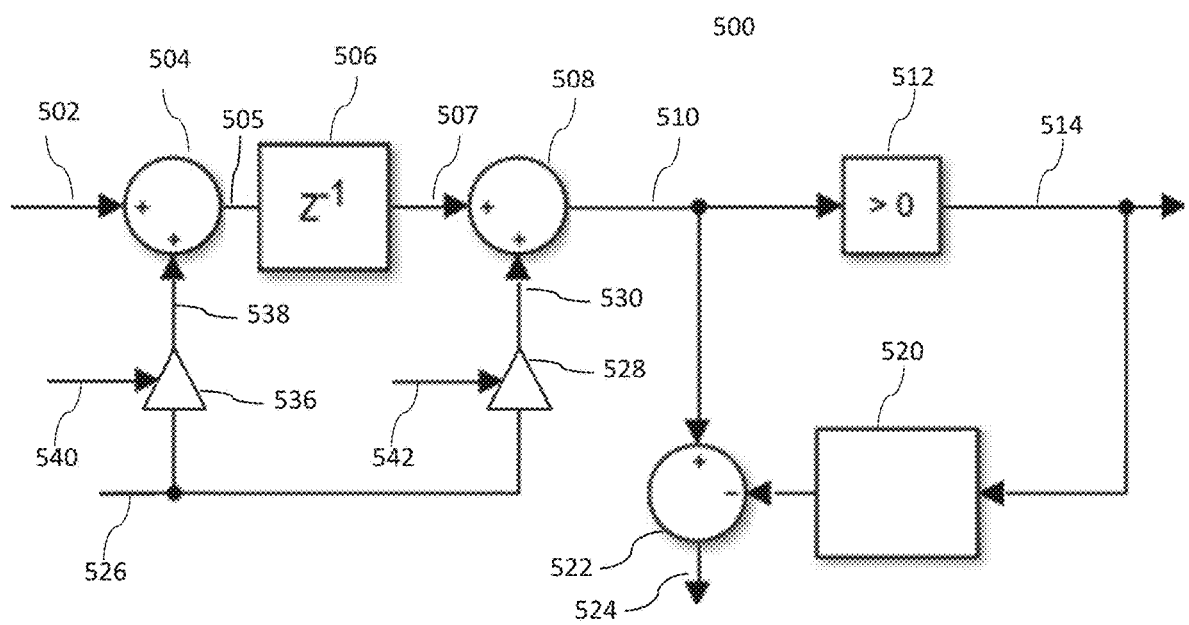
FIG. 5 is a block diagram of an exemplary delta-sigma modulator kernel h dynamically adjustable output frequency, according to some embodiments of the disclosed invention.

FIG. 5 is a block diagram of an exemplary delta-sigma modulator kernel h dynamically adjustable output frequency, according to some embodiments of the disclosed invention. As shown, a multi-bit oversampled signal $x_{int}[n]$ 502 (for example, based on signal 408 of FIG. 4) and a non-recursive residue signal 526 (for example, based on signal 420 of FIG. 4) is input to the DSM 500. The non-recursive residue signal 526 is multiplied by a first multiplier 536 to produce signal 538 for input to a first addition circuit 504. The non-recursive residue input is also multiplied by a second multiplier 528 to produce signal 530 for input to a second addition circuit 508. Addition circuit 504 sums the oversampled input signal 502 and 528 to produce the first sum signal 505. Delay block 506 delays the first sum 505 by one sample to produce 507.

A second addition circuit 508 sums signals 507 and 530 to produce an error-compensated signal 510. Signal 510 is quantized to 1 bit using a compare-to-zero comparator 512 to generate a modulated output signal 514. Signal 514 is then output from the DSM 500. Signal 512 is also fed to a decoder 520. Decoder 520 interprets the encoding of the output signal 514 to an appropriate scale and offset relative to the error-compensated signal 508. For some embodiments (e.g. 1-bit DSM), decoder 520 outputs a value of g when signal 514 has a value of "1" and a value of negative g when signal 514 has a value of "0" similar to the function of switch 116. The output of the decoder is combined with the error-compensated signal 510 by a third adder 522 to produce the 0-delay residue $\varepsilon[n]$ 524.

When used in recursive logic, this residue 524 is used as input 526 of another delta-sigma kernel instance. In the case that the DSM kernel is non-recursive, the residue input 526 is computed previously, and blocks 520 and output 524 are not needed. Control signal 540 is used to change the multiplier value of multiplier 536. Control signal 542 is used to change the multiplier value of multiplier 528. In some embodiments, control signals 540 and 536 are used to dynamically control the frequency response of the delta-sigma kernel for a desired output frequency band. In some embodiments, control signals 540 and 536 controlled through a signal from a frequency band controller (for example, based on signal 438).

The non-recursive implementation of both the residue computation and the DSM kernel enables pipelining for timing closure and parallelization for an output sample rate that is potentially much higher than the logic clock rate. Parallelization of the DSM kernel can be achieved by including in the design multiple instances of the DSM kernel, each of which are fed a single sample of $x_{int}$ and the corresponding residue value. For example, the samples of each of the represented signals could be serial (one sample per clock period) for some embodiments or parallel (multiple samples per clock period) for some embodiments. Parallel (or vector) sets of sample data drive the parallelization of the logic which produces and consumes it. The parallelization factors related to the signal sampling rate and the logic clock rate.

Figure 6:
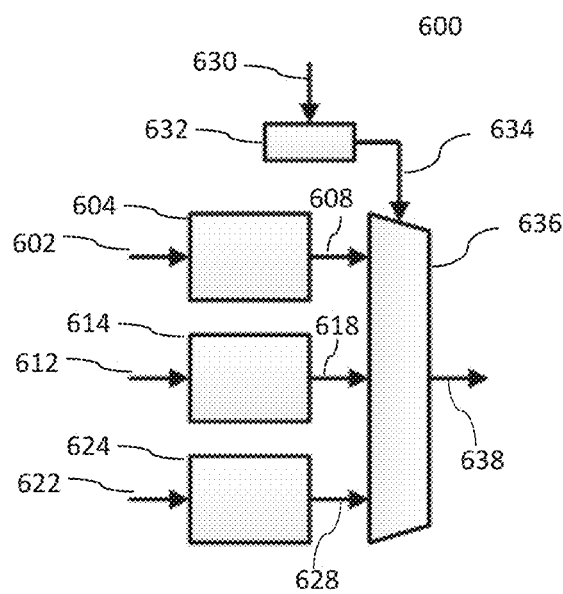
FIG. 6 is a simplified diagram of an exemplary non-recursive delta-sigma modulator with multiplexed dynamically-adjustable output frequency band, according to some embodiments of the disclosed invention.

In some embodiments, multiple instances of each block type exist in a given design, and the control signals control the multiplexed selection of the desired block instance or chain. FIG. 6 depicts an exemplary embodiment of a multiplexed non-recursive delta-sigma modulator 600 with dynamic output frequency band, according to some embodiments of the disclosed invention. Input signal 602 (for example, based on oversampled signal 307) is input into the first non-recursive modulator 604 which is configured to output over a first frequency band. The first non-recursive modulator 604 outputs a delta-sigma output 608 which is input to a multiplexer 636. Input signal 612 and output signal 618 of a second non-recursive delta-sigma modulator 614 are similarly configured, with signal 618 being input to the multiplexer 636. Input signal 622 and output signal 628 of a third non-recursive delta-sigma modulator 624 are similarly configured, with signal 628 being input to the multiplexer 636, A frequency band control signal 630 (for example, based on signal 312) is input to a selection controller 632, which outputs selection signal 634 to multiplexer 636 to select one of the multiplexer inputs to output as the delta-sigma output signal 638 (for example, signal 311), Similar to the non-recursive modulator, other components of the signal processing chain 300 could be multiplexed to provide the dynamic selection of output frequency band depicted in FIG. 3.

Figure 7:
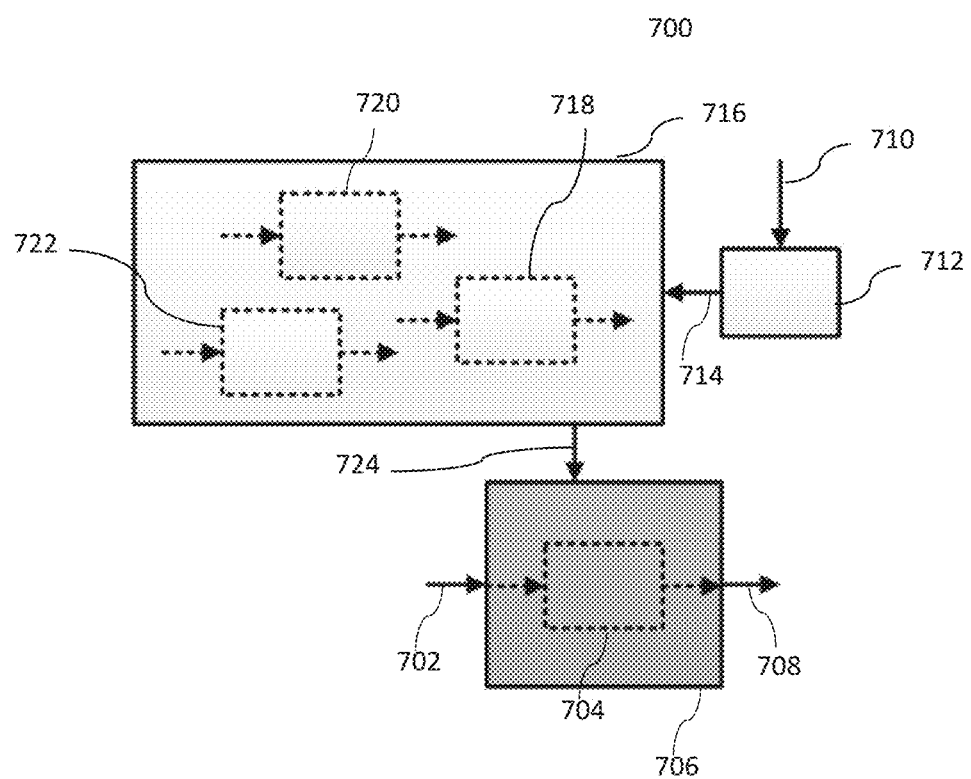
FIG. 7 is a simplified diagram of an exemplary non-recursive delta-sigma modulator with reconfigurable dynamically-adjustable output frequency band, according to some embodiments of the disclosed invention.

In some embodiments, control signals result in a reconfiguration of the processing chain for the desired output frequency band. FIG. 7 depicts an exemplary embodiment of a reconfigurable non-recursive delta sigma modulator with dynamic output frequency band 700 (for example, 310), configured with at least one non-recursive delta-sigma modulator configuration 704, according to some embodiments of the disclosed invention. Input signal 702 (for example, based on oversampled signal 307) is input into a block of reconfigurable circuitry 706 to generate delta-sigma output 708 (for example, signal 311). The reconfigurable circuitry 706 can be dynamically reconfigured by any of the non-recursive delta-sigma modulator configurations 718, 720, 722 in the configuration memory 716 through configuration interface 724. A frequency band control signal 710 (for example, based on signal 312) is input to a selection controller 712, which outputs a reconfiguration signal 714 which selects one of the non-recursive delta sigma-modulator configurations 718, 720, 722 with which to configure the reconfigurable circuitry 706. Similar to the non-recursive modulator, other components of the signal processing chain 300 could be dynamically reconfigured to provide the dynamic selection of output frequency band depicted in FIG. 3. In some embodiments, the dynamic reconfiguration modifies the functional logic. In some embodiments, dynamic reconfiguration modifies the logic clock source. In some embodiments, dynamic reconfiguration modifies the logic clock frequency. In some embodiments, dynamic reconfiguration modifies the output sample rate.

A more detailed approach of non-recursive computation of delta-sigma residues is described in the co-owned U.S. patent application Ser. No. 16/590,221, filed on Oct. 1, 2019 and entitled "Digital Delta-Sigma Modulator with Non-Recursive Computation of Residues," the entire contents of which is expressly incorporated by reference herein.

In some embodiments, the DSM output may pass through analog processing such as filtering, mixing, and amplification before being transmitted through a wired, wireless, or optical medium. In some embodiments, the analog filtering passband includes the operational frequency range of the DSM. In some embodiments, RF switches, filters, or tunable filters are used to filter out-of-band noise. In some embodiments, the filtering selection is dynamic to match the output frequency band of the delta-sigma modulator. In some embodiments, the DSM output may be stored or transmitted digitally and then processed digitally to recover an approximation of the signal x.

Each of these approaches represent variations on the method or system for non-recursive delta-sigma modulator with adjustable output frequency band. In some embodiments, the DSM is used in a delta-sigma DAC. The specific equations presented above describe exemplary logic/circuits for some embodiments of the disclosed invention, however, the method and system of the disclosed invention is not limited to the exemplary logic/circuits. Moreover, pipelining delays may be added along any of the logic paths for timing purposes, so long as the relative delay to the signals with which they are combined is correct. The block recursive DSM DAC of the disclosed invention may be used for a variety of applications and improves several different technologies. For example, it can be used with and improve radar systems, communication systems, electronic warfare, low-power or ad-hoc computer networks, airborne, communications, 4G/5G technologies, Global Positioning System (GPS) unmanned aerial vehicles (UAVs), medical equipment, driverless automobiles, and the like.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims and drawings.

What is claimed is:

1. A non-recursive delta-sigma modulator (DSM) with adjustable output frequency band comprising:
   a first input port for receiving a digital input signal;
   an input port for receiving a selection of output frequency band;
   a residue calculation circuit coupled to the input port for calculating delta-sigma residues non-recursively;
   a DSM kernel coupled to the output of the residue calculation circuit for generating an output of the DSM; and
   a second input port for receiving a control signal, wherein the control signal dynamically adjusts an output frequency band of the DSM.

2. The non-recursive DSM of claim 1, wherein the residue calculation circuit comprises a polyphase accumulator coupled to the input port for accumulating the digital input signal.

3. The non-recursive DSM of claim 2, wherein the polyphase accumulator comprises an interpolator and a digital mixer to interpolate and mix the digital input signal to a desired output sample rate and frequency.

4. The non-recursive DSM of claim 3, further comprising a frequency modulation circuit that receives the control signal and outputs a reconfiguration signal to the frequency modulation circuit to modulate an output of the interpolator to a desired output frequency band.

5. The non-recursive DSM of claim 2, wherein the polyphase accumulator is a 2-phase modulated polyphase accumulator where all even samples of the digital input signal are accumulated after inverting every other even sample and all odd samples of the digital input signal are accumulated after inverting every other odd sample.

6. The non-recursive DSM of claim 2, wherein the polyphase accumulator is a 3-phase modulated polyphase accumulator.

7. The non-recursive DSM of claim 1, wherein the kernel generates the output of the DSM using a comparison of DSM residue samples over time.

8. The non-recursive DSM of claim 1, wherein the residue calculation circuit calculates delta-sigma residues non-recursively at a rate equal to a sampling rate of the digital input signal.

9. The non-recursive DSM of claim 1, wherein the output of the DSM is in a one-bit format.

10. The non-recursive DSM of claim 1, wherein the output of the DSM is in a multi-bit format.

11. The non-recursive DSM of claim 1, further comprising a frequency band selection controller circuit that receives the control signal and outputs a reconfiguration signal to select an output control signal to control operation of one or more of the residue calculation circuit and DSM kernel.

12. The non-recursive DSM of claim 11, further comprising a frequency modulation circuit, wherein the output control signal controls operation of the frequency modulation circuit to select a modulation scheme.

13. The non-recursive DSM of claim 11, wherein the control signal controls operation of the residue calculation circuit to selecting a plurality of coefficients to use.

14. The method of claim 11, further comprising controlling said calculation of non-recursive delta-sigma residues to dynamically adjust the output frequency band of the DSM.

15. A digital-to-analog converter (DAC) comprising a non-recursive delta-sigma modulator (DSM), wherein the DSM comprises:
   a first input port for receiving a digital input signal;
   an input port for receiving a selection of output frequency band;
   a residue calculation circuit coupled to the input port for calculating delta-sigma residues non-recursively;
   a DSM kernel coupled to the output of the residue calculation circuit for generating an output of the DSM; and
   a second input port for receiving a control signal, wherein the control signal dynamically adjusts an output frequency band of the DSM.

16. A method for dynamically adjusting an output frequency band of a non-recursive delta-sigma modulator (DSM), the method comprising:
   receiving a digital input signal;
   calculating delta-sigma residues non-recursively;
   generating an output of the DSM; and
   dynamically adjusting an output frequency of the DSM responsive to a control signal.

17. The method of claim 16, further interpolating the digital input signal to produce an oversampled digital signal.

18. The method of claim 16, wherein calculating delta-sigma residues non-recursively comprises calculating a portion of the delta-sigma residues directly and without recursion, and calculating another portion of the delta-sigma residues recursively.

19. The method of claim 16, further comprising generating a reconfiguration signal to select an output control signal to control operation of one or more of the residue calculation circuit and DSM kernel, responsive to the control signal.

20. The method of claim 16, further comprising controlling an operation of a frequency modulation circuit to select a modulation scheme to dynamically adjust the output frequency band of the DSM.

* * * * *